United States Patent
Mendolia (10) Patent No.: US 6,181,950 B1
(45) Date of Patent: Jan. 30, 2001

(54) RADIOTELEPHONES WITH COPLANAR ANTENNA CONNECTORS AND RELATED ASSEMBLY METHODS

(75) Inventor: Gregory S. Mendolia, Forest, VA (US)

(73) Assignee: Ericsson Inc., Research Triangle Park, NC (US)

(*) Notice: Under 35 U.S.C. 154(b), the term of this patent shall be extended for 0 days.

(21) Appl. No.: 09/299,405

(22) Filed: Apr. 26, 1999

Related U.S. Application Data (63) Continuation of application No. 08/772,892, filed on Dec. 24, 1996, now Pat. No. 5,907,817.

(51) Int. Cl.$^7$ ............................................. H04B 1/00
(52) U.S. Cl. ............................... 455/550; 455/575
(58) Field of Search ......................... 343/70 L; 361/814; 439/63, 581, 65, 78, 81, 83, 329, 876; 455/90, 575

(56) References Cited

U.S. PATENT DOCUMENTS

| | | | |
|---|---|---|---|
| 4,184,729 | * 1/1980 | Parks et al. | 339/17 |
| 4,697,143 | 9/1987 | Lockwood et al. | 333/246 |
| 4,718,110 | 1/1988 | Schaefer | 455/90 |
| 4,823,235 | 4/1989 | Suzuki et al. | 439/64 |
| 4,842,527 | * 6/1989 | Tellam | 439/63 |
| 5,018,005 | * 5/1991 | Lin et al. | 357/80 |
| 5,105,171 | 4/1992 | Wen et al. | 333/116 |
| 5,133,676 | 7/1992 | Hutchinson et al. | 439/581 |
| 5,158,483 | 10/1992 | Fishman et al. | 439/668 |
| 5,225,796 | * 7/1993 | Williams et al. | 333/12 |
| 5,278,570 | 1/1994 | Jaramillo et al. | 343/702 |
| 5,551,080 | * 8/1996 | Chambes et al. | 455/348 |
| 5,585,806 | 12/1996 | Ogino et al. | 343/702 |
| 5,594,457 | * 1/1997 | Wingo | 343/702 |
| 5,613,859 | 3/1997 | Bellantoni et al. | 439/63 |
| 5,613,861 | * 3/1997 | Smith et al. | 439/81 |

OTHER PUBLICATIONS

Kraus, John D. "Electromagnetics" McGraw–Hill, (c) 1984 ISBN 0–07–035423–5, 1984.*

* cited by examiner

Primary Examiner—Reinhard J. Eisenzopf
Assistant Examiner—Makoto Aoki
(74) Attorney, Agent, or Firm—Myers Bigel Sibley & Sajovec, P.A.

(57) ABSTRACT

A coplanar antenna connector which interconnects an antenna and a printed circuit board of a portable radiotelephone is described. In particular, the antenna connector includes an antenna connector conductor strip having opposing first and second ends adapted for transmitting a radiotelephone signal from a source to an antenna or from an antenna to a receiver. The connector also includes at least one antenna connector ground strip having first and second opposing ends adapted for transmitting a radiotelephone signal. The at least one antenna connector ground strip and the antenna connector conductor strip are held in coplanar alignment, preferably by a nonconducting carrier ribbon. Each of the at least one antenna connector ground strips and the antenna connector conductor strip are spaced-apart and define a gap therebetween. The flexible antenna connector provides an easy, cost effective connection between the antenna and the printed circuit board in a manner which minimizes the amount of printed circuit board space needed therefor. The connector is also easily adaptable for use with retractable antennas. Also described are radiotelephones, portable radiotelephone antenna assemblies, and related radiotelephone assembly methods employing a flexible antenna connector.

18 Claims, 7 Drawing Sheets

RADIOTELEPHONES WITH COPLANAR ANTENNA CONNECTORS AND RELATED ASSEMBLY METHODS

RELATED APPLICATION

This application is a continuation of U.S. patent application Ser. No. 08/772,892; filed on Dec. 24, 1996, now U.S. Pat. No. 5,907,817 which is hereby incorporated herein in its entirety by reference.

FIELD OF THE INVENTION

The present invention relates to radiotelephones, and more particularly relates to portable radiotelephones.

BACKGROUND OF THE INVENTION

Radiotelephones continue to grow in popularity because they enable flexible channels of communication. Conveniently, increasing numbers of radio-towers and satellite systems are generally each increasing a users access and availability even in rural or remote areas. This increased popularity produces a sophisticated consumer who can demand sometimes competing product specifications or criteria. For example, desired performance parameters typically include improved signal quality, operational features, and durability all the while maintaining an aesthetically pleasing appearance. In addition, many users desire improved transportability, which in turn, generally dictates that the product configuration be provided as a slim and miniaturized design.

In operation, portable radiotelephones transmit and receive signals from a transmission source such as a transmission tower or satellite. This tower or satellite is typically positioned at a site which is remote from the user of the portable radiotelephone. It will be appreciated that generally the further away a signal is from its transmission source, the weaker the signal and the higher the potential for noise to be introduced into the signal. Generally, when a signal is directed to a radiotelephone, the radiotelephone antenna acts to receive the signal and provide the signal to the radiotelephone to be processed and output. Because the input signal is directed to the radiotelephone from a remote distance, it can be subjected to noise interferences present in the environment which can degrade the quality of the resultant voice signal. Shielding signal lines in the radiotelephone can help to prevent this degradation.

Further, as noted above, many of the more popular hand-held telephones are undergoing miniaturization. Indeed, many of the contemporary models are only 11–12 centimeters in length. Portable radiotelephones employ an internally disposed printed circuit board which generally controls the operation of the radiotelephone. Because the printed circuit board is disposed inside the radiotelephone, its size is also shrinking, corresponding to the miniaturization of the portable radiotelephone. Unfortunately, desirable operational and performance parameters of the radiotelephone can potentially require a large amount of dedicated space on the surface of the printed circuit board. Therefore, it is desirable to efficiently and effectively utilize the limited space on the printed circuit board.

This miniaturization can also create complex mechanical and electrical connections with other components such as the outwardly extending antenna which must generally interconnect with the housing for mechanical support, and to the printed circuit board in order for the signal to be processed. In addition, these type of connections are potentially further complicated by the use of retractable antennas which have dynamic components, i.e., components which move or translate with respect to the housing and the printed circuit board.

Figure 1:
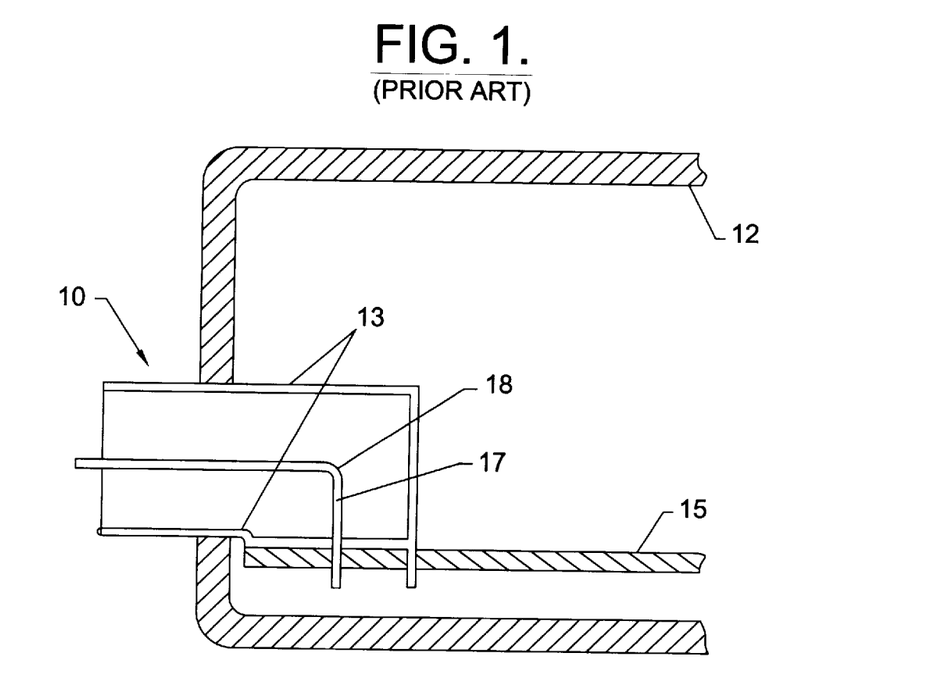
FIG. 1 is an enlarged sectional view of a radiotelephone with a prior art antenna connector.

Referring to FIG. 1, conventional portable radiotelephones have used a variety of antenna connections to interconnect the antenna to the housing and the printed circuit board. The antenna and the printed circuit board 15 typically include one cylindrical ground path 13 and one live signal path 17 which are connected by a connector 10. For example, as illustrated in FIG. 1, a coaxial connector 10 is inserted into the housing 12 and soldered directly onto the printed circuit board 15. The connector 10 forms a right angle 18 with respect to the printed circuit board 15. Although this type of connection can provide a solid electrical connection and good signal shielding, it generally uses a relatively large mounting area both inside of the housing 12 and on the printed circuit board 15. Further disadvantageously, this type of connector 10 is difficult to adapt for use with retractable antennas. This is because the connector 10 must somehow electrically interconnect with a component which typically includes a dynamic member which is longitudinally movably positioned in a plane which is above and parallel to the printed circuit board.

Figure 2:
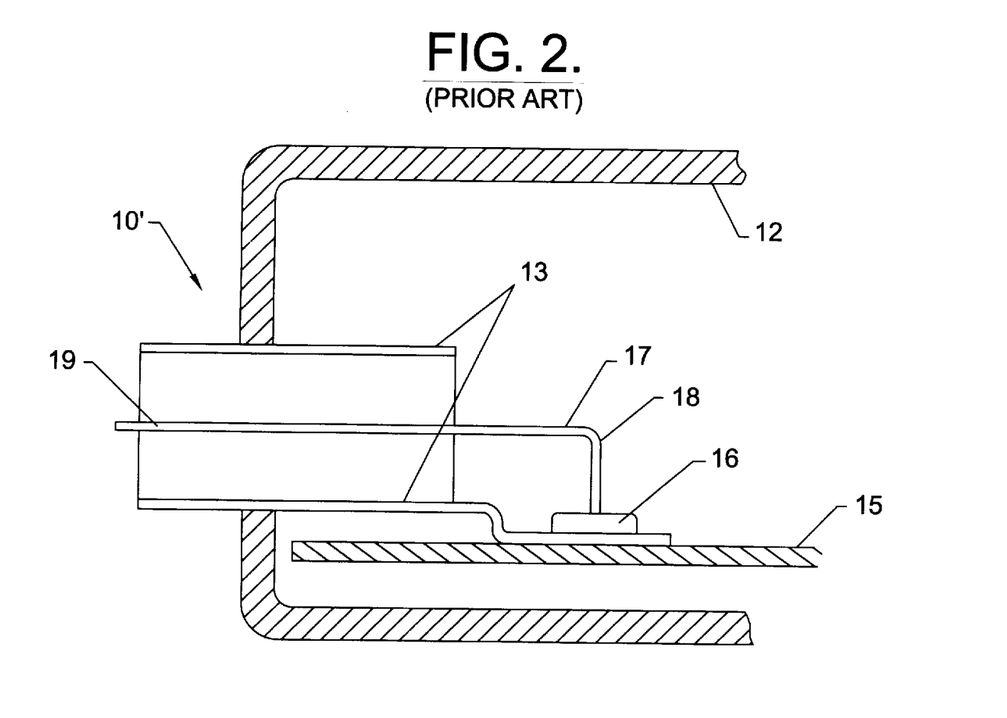
FIG. 2 is an enlarged sectional view of a radiotelephone having an alternative prior art antenna connector.

Another example of a known antenna connection used on portable radiotelephones is illustrated in FIG. 2. In this type of configuration, a connector 10' is inserted into the housing 12 and mechanically attached to the printed circuit board such as with a screw or a snap 16. Thus, a mechanical force is applied to the connector 10' to force it against the printed circuit board 15 in order to make electrical contact with contact pads positioned on the printed circuit board 15. The antenna live signal path 17 extends via the connector 10' into the housing 12 at a right angle 18 with respect to the printed circuit board 15 through an outwardly extending projection 19. Unfortunately, this type of connection generally provides a poor electrical connection and typically poorer shielding in the signal path. Further, the connection generally has an associated impedance which is non-standard, making manufacturing inspection tests difficult because most testing equipment is designed to a 50 Ω standard. In addition, this type of connection also generally uses an undesirable amount of space in the housing and on the printed circuit board.

OBJECTS AND SUMMARY OF THE INVENTION

It is an object of the present invention to provide improved radiotelephone antenna connectors.

It is a further object of the present invention to provide a radiotelephone antenna connector which is easy to manufacture, to connect to the printed circuit board, and which also minimizes the amount of mounting space needed on the printed circuit board.

It is an additional object of the invention to provide an antenna connector which is easily adaptable for use with a retractable antenna and which has good signal shielding.

It is a further object of the invention to provide a radiotelephone antenna and printed circuit board connection with a standard 50 Ω impedance rated interface.

These and other objects, advantages, and features are provided by a coplanar antenna connector which interconnects an antenna and a printed circuit board of a portable radiotelephone. In particular, the antenna connector includes an antenna connector conductor strip having opposing first and second ends adapted for transmitting a radiotelephone signal between an antenna and a source and receiver. The connector also includes at least one antenna connector ground strip having first and second opposing ends adapted for transmitting a radiotelephone signal between a source/receiver and an antenna. At least one antenna connector ground strip and the antenna connector conductor strip are held in coplanar alignment, preferably by a nonconducting carrier ribbon. Each of the at least one antenna connector ground strips and the antenna connector conductor strip are spaced-apart and define a gap therebetween. In a preferred embodiment, the at least one antenna connector ground strip comprises first and second antenna connector ground strips disposed on opposing sides of the antenna connector conductor strip. As such, the antenna connector first ground strip and the antenna connector conductor strip define a first gap therebetween and the antenna connector second ground strip and the antenna connector conductor strip define a second gap therebetween. Alternatively, the antenna connector can be a flex connector having separate ground and signal conducting traces thereon. Further alternatively, the conductors can be configured sufficiently rigid as to maintain coplanar alignment without a carrier body.

Advantageously, the connector is configured to be structurally flexible such that when assembled to the antenna and radiotelephone it minimizes the amount of space needed to mount the antenna connector and electrically engage with the printed circuit board and the antenna. The ground path is preferably provided by attaching an upper portion of the at least one ground strip to a conducting ring insert positioned in one end of the radiotelephone. The live signal path is provided by attaching the upper portion of the signal strip to a corresponding live signal portion on the antenna. The lower portions of the connector are separately attached to corresponding printed circuit board contact pads thereby completing the spaced-apart electrical paths.

In a preferred embodiment, the antenna defines a central axis longitudinally extending through the center thereof, and the flex connector extends arcuately from the antenna to the printed circuit board with respect to the axis along at least a portion of the length of the connector electrical and ground paths. Preferably, the connector employs materials with a spring force which, upon assembly, enables a self-contacting or frictional engagement of the connector to the printed circuit board. This self-contacting and arcuate configuration frees up space previously used for conventional antenna connectors and allows for easy assembly. Similarly, in an additional embodiment, a coplanar interconnection can also be used to provide a path from the transmitter and receiver on the printed circuit board to an external antenna connector. This type of interconnection can be used to connect accessories to the cellular phone.

Radiotelephone assembly methods according to the present invention enable the assembly of a coplanar antenna connector, antenna, and printed circuit board thereby completing ground and live signal electrical paths therebetween.

Advantageously, the coplanar connector provides good signal shielding along the signal path—and can even provide good shielding along the entire path—and can also provide a standard 50 Ω impedance interface. Additionally and advantageously, the coplanar connector provides a light weight and easy to manufacture and assemble configuration and a connector which is easily adaptable for use with retractable antennas.

The foregoing and other objects and aspects of the present invention are explained in detail in the specification set forth below.

DETAILED DESCRIPTION OF PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. In the drawings, the thickness of layers and regions are exaggerated for clarity. Like numbers refer to like elements throughout.

In the description of the present invention that follows, certain terms are employed to refer to the positional relationship of certain structures relative to other structures. As used herein, the term "longitudinal" and derivatives thereof refer to the general direction defined by the longitudinal axis of the radiotelephone housing associated with an antenna that extends upwardly and downwardly between opposing top and bottom ends of the radiotelephone when held in the hand of a user. As used herein, the terms "outer", "outward", "lateral" and derivatives thereof refer to the direction defined by a vector originating at the longitudinal axis of the radiotelephone and extending horizontally and perpendicularly thereto. Conversely, the terms "inner", "inward", and derivatives thereof refer to the direction opposite that of the outward direction. Together the "inward" and "outward" directions comprise the "transverse" direction.

Figure 3:
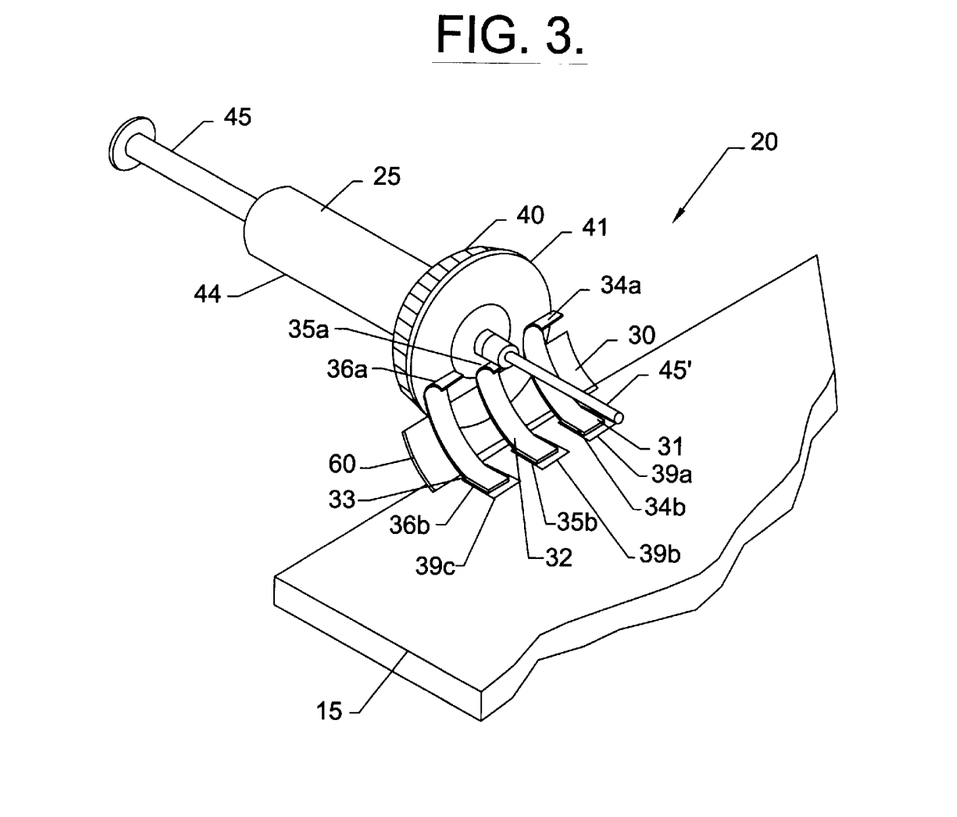
FIG. 3 is a fragmented perspective view of a radiotelephone of the present invention illustrating the assembly of a retractable antenna to the printed circuit board.
Figure 6:
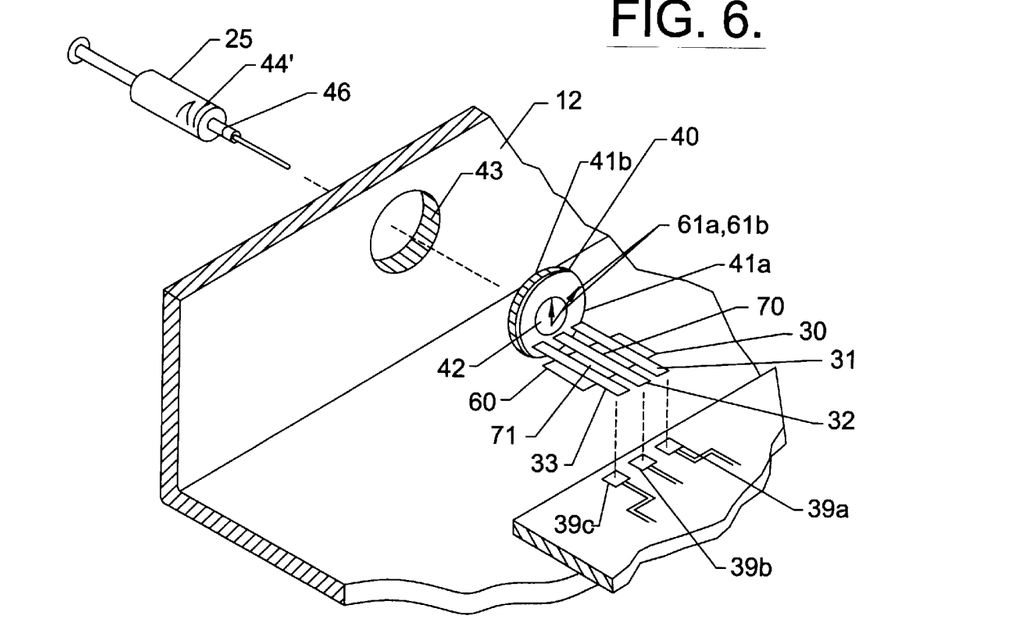
FIG. 6 is a fragmented exploded view of a radiotelephone according to the present invention.

Referring now to the drawings, FIG. 3 illustrates a radiotelephone antenna assembly 20 according to one embodiment of the present invention. The assembly 20 comprises an antenna 25, a housing insert 40, a printed circuit board 15, and an antenna connector 30. As illustrated, the antenna 25 is a retractable antenna with a stationary portion 44 which is attached to the radiotelephone housing 12. As shown, the antenna defines a central axis extending in the longitudinal direction. The antenna includes axially aligned outwardly and inwardly extending projections 45, 45'. The outwardly extending projection 45 extends longitudinally out of the housing and the inner portion 45' is contained within the interior of the housing 12. As best illustrated by FIG. 6, the inner portion 45' includes a live signal contact surface 46 thereon.

Figure 5:
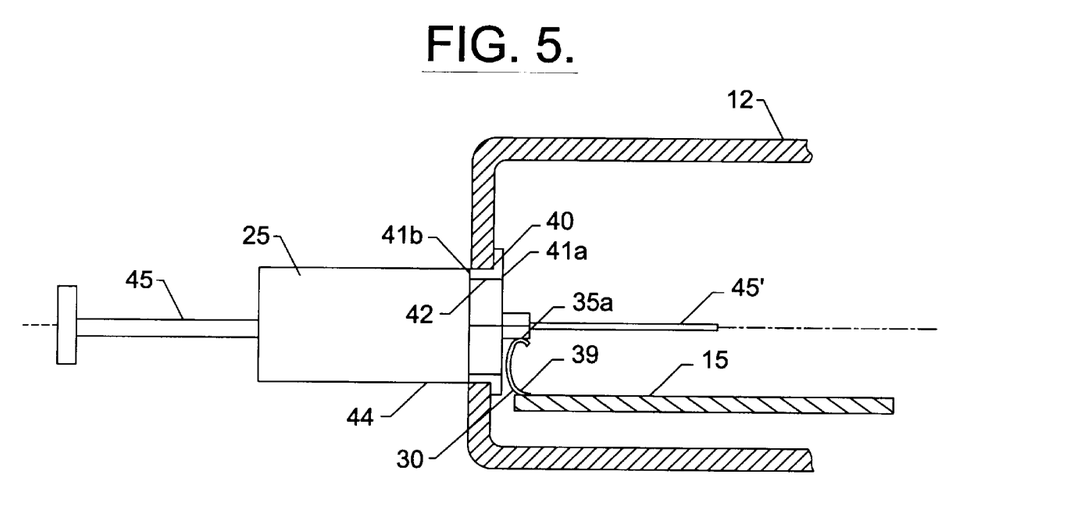
FIG. 5 is an enlarged partial section view of an assembled radiotelephone illustrating the relative position of an antenna, housing, printed circuit board, and connector according to one embodiment of the present invention.

As illustrated in FIG. 5, the antenna 25 is preferably threadably engaged with an insert 40 positioned in one end of the housing 12. Advantageously, a releasably threaded engagement of the antenna and the insert provides for easy replacement and interchangeability of malfunctioning or broken antenna components.

In order to provide a lightweight radiotelephone, it is preferred that the housing material be both lightweight and durable. Further, in order to lower manufacturing costs, it is preferred that the housing 12 be a multi-piece construction. Examples of preferred housing materials include, but are not limited to, a lightweight composite, resin, or plastic material which can be easily produced such as by injection molding. An example of a multi-piece housing 12 includes a two piece housing which has a front member and a rear member which can be engaged to be assembled theretogether to form the radiotelephone housing (not illustrated).

The insert 40 is made from a conducting material such as brass, stainless steel, copper, and the like. The insert is mechanically attached to the housing 12 such as by a heat staking process. Alternative attachment means can be employed, such as by threadably engaging the insert to the housing, employing a high strength adhesive, and the like. Preferably, the insert 40 is positioned in one end of the housing 12 to enable the antenna 25, when assembled thereto, to longitudinally extend outwardly of the housing. Of course, alternative configurations such as an insert which is laterally positioned in the side of the housing can also be employed. In such an embodiment, an antenna may laterally extend out of a side of the housing, or may rotatably attach to the laterally positioned insert so as to be longitudinally extendable when rotated in an upward manner (not illustrated).

As best illustrated in FIGS. 3 and 6, the insert 40 is preferably a ring or circular skirt shaped insert having opposing top 41b and bottom 41a ends with an opening 42 formed through the center thereof. As shown in FIG. 6, the opening 42 is adapted to receive a threaded portion of the antenna 44'. Also as illustrated, the circular skirt or ring insert 40 is preferably axially aligned with the centerline of the antenna. The bottom end 41a of the skirt or ring insert 40 includes a planar surface having a lateral or radial thickness defined by two concentric circles 61a, 61b drawn with respect to the central axis. The bottom end 41a provides a ground contact surface for the ground path of the radiotelephone assembly connector 30.

As best illustrated in FIGS. 5 and 6, the printed circuit board 15 is disposed inside of a radiotelephone housing 12. It is preferred that the printed circuit board include connector contacts 39a, 39b, 39c positioned in substantial linear alignment along a top surface adjacent one end of the radiotelephone housing 12. Preferably, the contacts or pads 39a, 39b, 39c are arranged so as to enable coplanar connections with the connector 30 as illustrated in sectional view in FIG. 5. Once assembled, the electrical contacts 39a, 39b, 39c on the printed circuit board 15 enable the antenna connector 30 to contact, flexibly bend, and arcuately extend between the antenna 25 and the printed circuit board 15. Advantageously, this configuration minimizes the amount of interior housing space needed to electrically and mechanically mount the connector and interconnect the antenna and printed circuit board.

As shown in FIGS. 3 and 6, a connector 30 includes a conductor strip 32 having opposing first and second ends 35a, 35b adapted for transmitting a radiotelephone signal from an internal source to an antenna 25. Similarly, the connector is also adapted for transmitting a radiotelephone signal from an external source received by the antenna to the internal signal processor of the radiotelephone. The connector further includes at least one ground strip 31 (FIG. 4A). FIGS. 3 and 6 illustrate an alternative embodiment employing two ground strips 31, 33 having opposing first and second ends 34a, 34b and 36a, 36b, respectively. As illustrated, the ground strips 31, 33 are positioned on opposing sides the conductor strip 32. As such, a first ground strip 31 and the conductor strip define a first gap 70 therebetween and a second ground strip 33 and conductor strip 32 define a second gap 71 therebetween.

Figure 7:
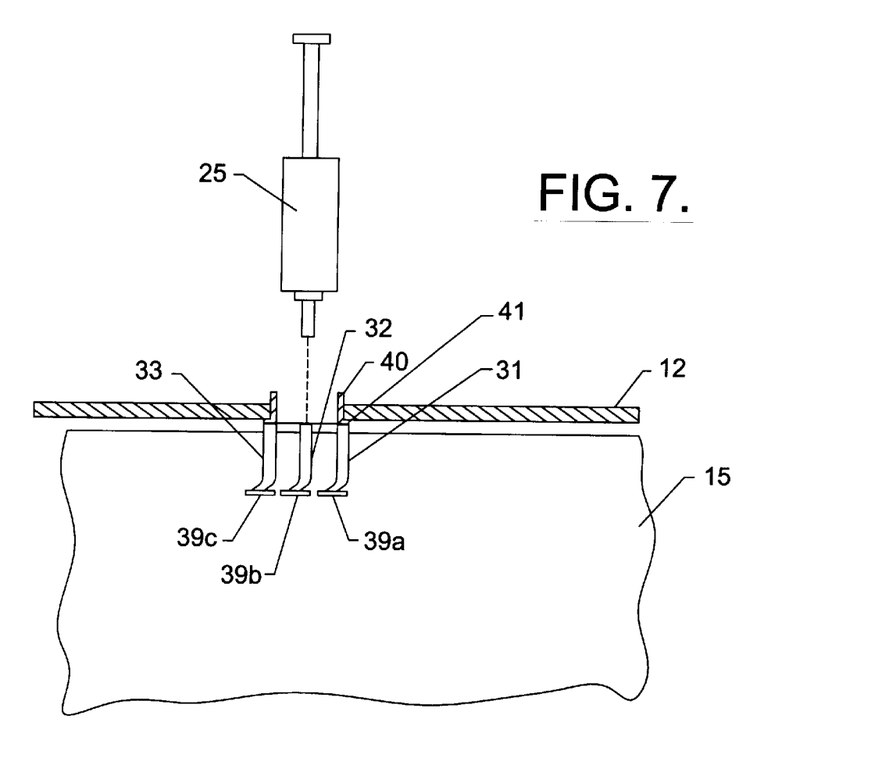
FIG. 7 is a cutaway front section view of the assembly of the present invention illustrating the assembly of a retractable antenna to an antenna connector positioned in a radiotelephone housing and connected to a printed circuit board.

It is also preferred that the ground strips and the conductor strip 31, 32, 33 be positioned on a thin film non-conducting carrier ribbon 60 in order to maintain the strips in mutual coplanar alignment. The carrier ribbon 60 is preferably thin but sufficiently strong to provide the mechanical rigidity or structure necessary to hold the connector together and also be able to withstand the heat energy discharged by the electrical fields in the connector which typically runs at about ¼ to ½ Watt. Exemplary thicknesses include about 10–25 mils or about 2 millimeters. Alternatively, as shown in FIG. 7, the signal and ground conductor strips 31, 32, 33 can be configured to be structurally sufficiently rigid to enable coplanar alignment without a carrier ribbon or backing. An additional alternative is to employ a hybrid of the carrier and the non-carrier connector, such as by employing a supplemental lateral support structure. For example, a plurality of spaced apart laterally disposed backing strips or truss strips (not shown) to help maintain the strips in coplanar alignment.

In operation, the electromagnetic field(s) is constrained within the gap(s). Thus, the coplanar connector acts as a coplanar stripline (one ground, one live signal conductor) or coplanar waveguide connector (one center signal conductor). It is preferred that the first gap and second gap 70, 71 are the same size and remain constant in width along the length of the carrier ribbon. This will help contain the electromagnetic fields in a tightly constrained electric path (s) within the connector 30.

Figure 9:
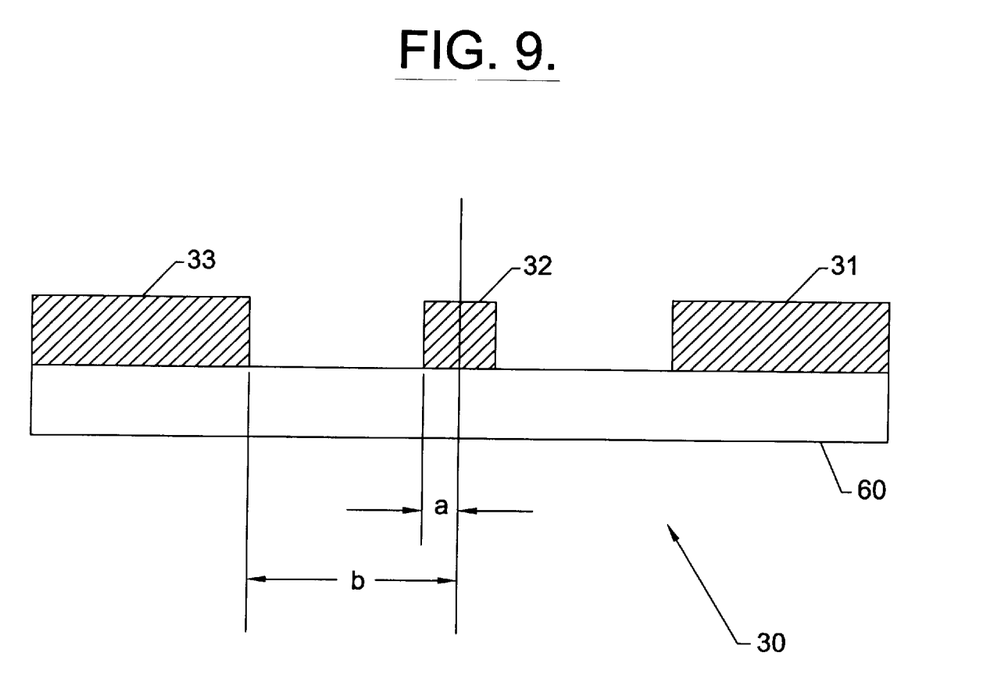
FIG. 9 is a greatly enlarged sectional view of an antenna connector illustrating a preferred gap and signal conductor size relationship of the present invention.

For thin carriers 60 constructed of low dielectric constant material (or for connectors without carriers), the dielectric constant can be assumed to be approximately equivalent to air (1.0). Regarding preferred gap and signal conductor sizes, as illustrated by FIG. 9, a preferred ratio of the distance from the centerline of the signal conductor to its outer edge is equal to (a). The distance between the centerline of the signal conductor and the ground conductor inner peripheral edge is shown as (b). Stated differently, b is the gap 70 width plus distance (a). Thus, for a very thin low dielectric material, it is preferred that the conductors be positioned and sized such that the ratio (a/b) is about equal to 0.85. For example, where a=1.7 mm and b=2.0 mm. However, if heavier or alternative thicknesses or substrate materials are employed as the carrier a higher dielectric strength and correspondingly lower (a/b) ratio is preferred. Examples of alternative materials, dielectric constants, and approximate corresponding preferred ratios include:

| Material | Est. Dielectric Constant | Ratio |
| --- | --- | --- |
| POLYSTYRENE | 2.5 | .8 |
| ROGERS 6010 | 10.3 | .5 |
| 3M ® EPSILAM 10 | 10.3 | .5 |

A properly sized conductor strip along with a properly sized and corresponding gap width (especially if held to tight manufacturing tolerances of for example ±1–2 mils) will help provide good signal shielding and a constant impedance. Preferably, the gap and conductor strips are sized to define a standard 50 Ω signal path. As will be appreciated by one of skill in the art, most test equipment and cabling also operate with a standard 50 Ω impedance, making the radiotelephone easy to test with standard equipment.

The ground strips 31, 33 and the conductor strip 32 are preferably made from conducting materials and sized such that they will provide sufficient spring forces when engaged with or assembled to mating antenna or printed circuit board surfaces. For example, one or both ends of the strips 31, 32, 33 can flexibly bend to rest against and contact respective electrical contact surfaces once positioned in place during assembly so as to be self-contacting and frictionally engage with mating surfaces on the printed circuit board. One or more of the ends of each of the strips can employ alternative fixedly attachment or joining techniques such as soldering, brazing, high temperature adhesives, and the like. Exemplary conductor and ground strip materials include, but are not limited to, beryllium copper, nickel plated beryllium copper, gold plated copper and the like.

Alternatively, the connector can be manufactured from an integral configuration such as a flexible polymer circuit, or thin flexible plastic backing having separate electrical traces positioned thereon (not illustrated). In this embodiment, the conductor strips can be etched in the connector itself which can provide a spring-like flex structure to facilitate self-contacting engagement of the electrical contact surfaces and can also provide assurance that the electrical paths are maintained in alignment.

As illustrated in FIGS. 3 and 6 the strips 31, 32, 33 longitudinally extend beyond the body of the carrier ribbon 60. This allows one or the other end to be accessible to be fixedly soldered to its respective electrical contact surface. However, the as will be appreciated by one of skill in the art, the invention is not limited thereto. For example, the carrier 60 can be coextensive with the strips or be positioned only between the gaps 70, 71 of the strips. The configuration of the carrier or flex connector need only enable the integrity of the electrical paths to be maintained and also allow the strips to separately engage with corresponding antenna and printed circuit board contacts. It is preferred that whatever carrier configuration (or non-carrier configuration) employed enables both the gap(s) 70 and the mutual coplanar alignment of the strips 31, 32 to be consistently maintained.

Figure 4:
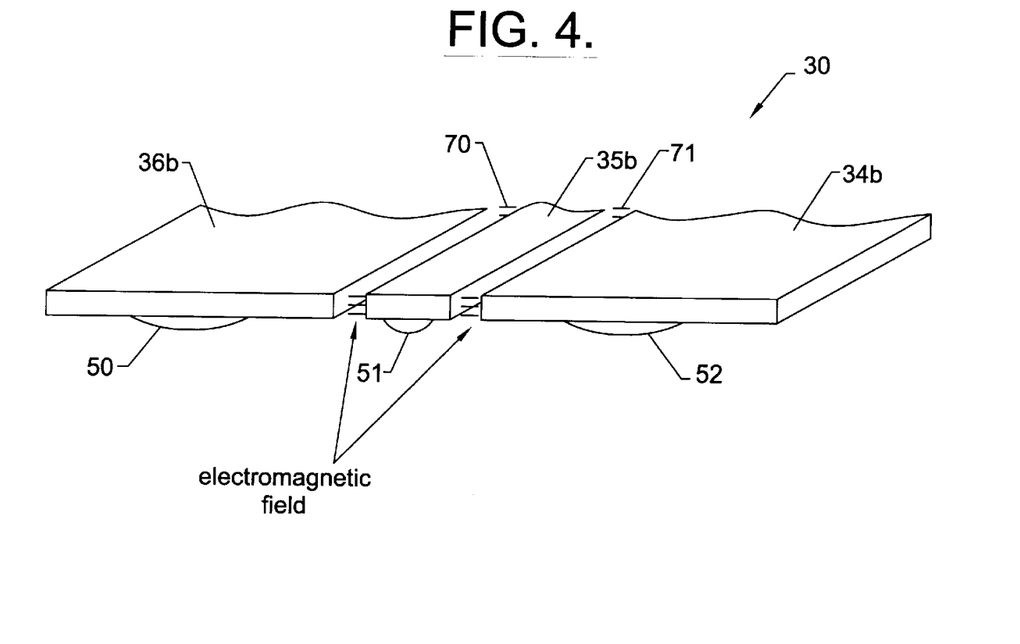
FIG. 4 is a greatly enlarged view of an antenna connector according to the present invention illustrating two ground paths on opposing sides of a live signal path.
Figure 4A:
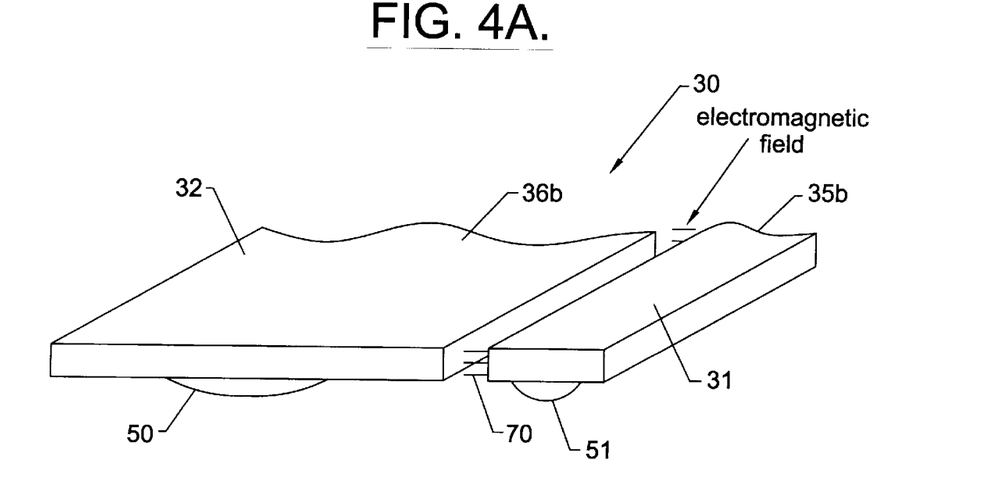
FIG. 4A is a greatly enlarged view of an alternative embodiment of an antenna connector according to the present invention illustrating a single ground path and a live signal path.

FIGS. 4 and 4a illustrate an antenna connector 30 employing downwardly extending contact protrusions 50, 51, 52 positioned adjacent the printed circuit board engaging ends 34b, 35b, 36b of the connector. FIG. 4A illustrates an alternative embodiment of an antenna connector 30 employing one ground strip 31 and one conductor signal strip 32, again employing downwardly extending contact protrusions 50, 51. The downwardly extending contact protrusions can be provided in any number of manners, such as, but not limited to, an indented dimple pressed into the strip at the end of the connector. The protrusion(s) 50, 51, 52 provide improved electrical contact with the contact pads 39a, 39b, 39c on the printed circuit board 15.

Alternatively, the printed circuit board 15 contact pads can employ protrusions or raised contact surfaces (not illustrated). The protrusions help alleviate potential electrical contact degradation attributed to dirt collected on one or more of the mating contact surfaces. It is preferred that the printed circuit board contact pads 39a, 39b, 39c have a larger area so as to provide assembly tolerances which enable the corresponding connector contact surfaces to electrically contact the pads without exact dimensional and alignment precision of the mating components.

Figure 10:
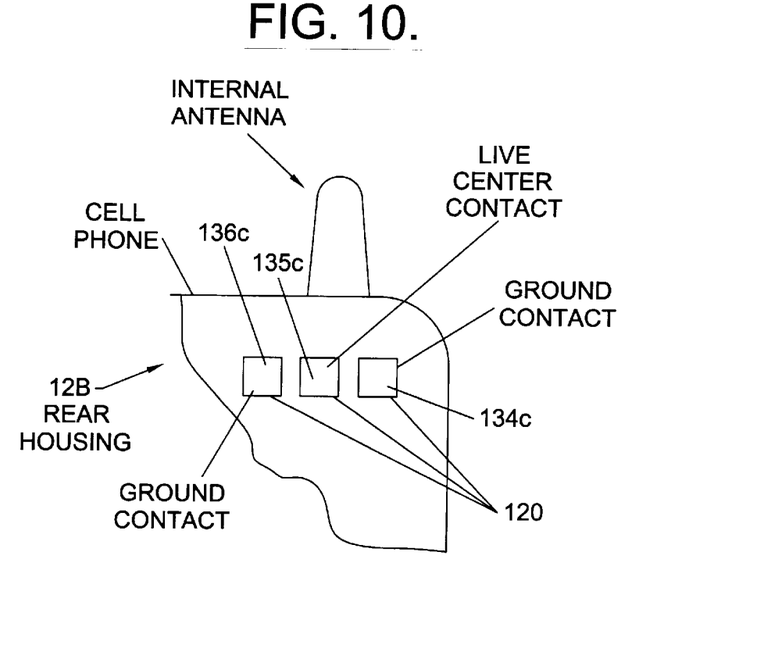
FIG. 10 is a partial view of an alternative embodiment of the present invention illustrating an external antenna connector.
Figure 11:
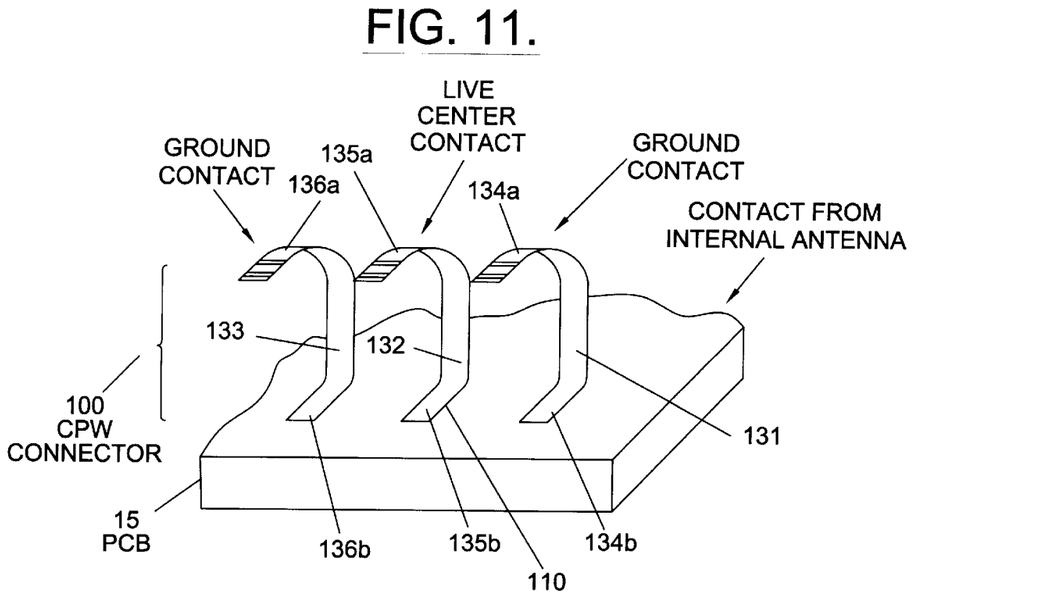
FIG. 11 is a greatly enlarged cutaway perspective view of the alternative embodiment illustrated in FIG. 10.

FIGS. 10 and 11 illustrate a similar additional embodiment of the present invention, an external coplanar antenna connector 100. The external antenna connector 100 can be used to connect accessories to the cellular phone. Similar to the antenna connector described hereinabove, the externally accessible connection is enabled via a coplanar interconnection. The coplanar interconnection provides a path from the transmitter and receiver 110 disposed on the printed circuit board 60 to an externally exposed and accessible connector portion 120. Conventionally, coaxial connectors are employed such as those described for antenna interconnections. Advantageously, an external coplanar antenna connector 100 can be more cost effective and consume less space in the housing or on the printed circuit board as compared to coaxial type connectors. The external antenna connector operates similarly to the antenna connector described hereinabove; therefore, one of skill in the art will understand that previously stated descriptions are applicable to this embodiment and, as such, certain of this material will not be repeated hereinbelow.

As shown, the external antenna connector includes a central conductor strip 132 and two opposing ground conductor strips 131, 133. Alternatively, structural non-conducting support materials, such as plastic, may be used to interconnect and hold the strips to keep them in alignment and thus integrate the separate conductor and ground strip(s) 131, 132, 133 theretogether.

The externally exposed connector portion 120 is positioned on the rear of the housing unit 12b to be externally accessible by desired accessory components. The housing 12b has a plurality of openings corresponding to the number of ground and conductor strips employed 131, 132, 133. Accordingly, a plurality of externally accessible connector termination points—e.g., strip line (one conductor, one ground) or coplanar embodiment (two grounds, one central conductor)—extend to enable contact between an external device and the externally accessible contacts 134c, 135c, and 136c. As such, the upper portion of the conductors 134a, 135a, 136a preferably arcuately and freely (not fixably secured) extend into or adjacent the housing openings so as to provide exposed contact surfaces 134c, 135c, 136c, for mating with an externally supplied accessory. The exposed contact surfaces 134c, 135c, 136c, may be coated with a corrosion resistant film to minimize environmental induced degradation of the contact surfaces. The housing openings can be formed into the housing material in any number of techniques such as molding, drilling, and the like. Further, as described for the antenna coplanar connector, the preferred conductor materials, conductor gaps, and conductor widths also apply to the external connector embodiment of the present invention.

Preferably, the conductor strip and ground strips are soldered to the printed circuit board to firmly attach the strips thereto. It is also preferred that the conductor and ground strips 131, 132, 133 be formed of material which is substantially self-supporting in order to provide sufficient rigidity to maintain alignment and remain in a proper extending position irrespective of the position of the telephone.

Additionally, the center or live signal conductor 135 can be configured such that upon its engagement, it disengages the signal contact to the telephone antenna in order to provide a single path from the printed circuit board to the external connector. For example, the center or live conductor can be shaped such that upon contact and engagement with an accessory, it is mechanically depressed into the telephone. This mechanical depression can transmit a mechanical force, such as a bending or deflecting moment on the conductor 135, into the telephone housing to contact and move a closely positioned antenna conductor contact and disengage the internal antenna signal contact therewith (not shown).

Figure 8:
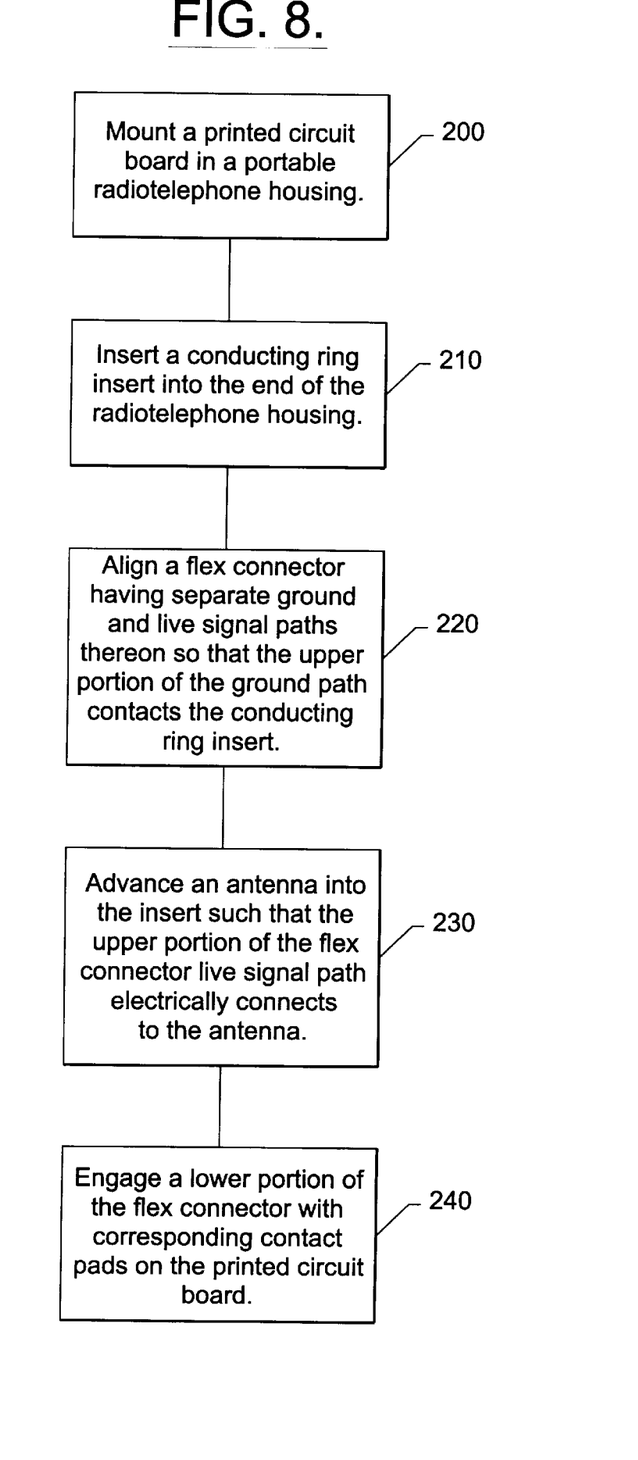
FIG. 8 is a block diagram illustrating a radiotelephone assembly method of the present invention.

One assembly method is illustrated in the block diagram of FIG. 8. A printed circuit board having at least one ground and a spaced-apart signal antenna contact surface thereon is internally mounted to a radiotelephone housing such that the contact surfaces are adjacent one end of the housing (Block 200). A conducting ring insert is inserted into the end of the housing (Block 210). An upper portion of an antenna flex connector having separate ground and live signal electrical paths longitudinally extending along its length is fixedly attached (such as by soldering) to the conducting ring insert (Block 220). As such, the ground path of the flex connector is electrically connected to the ring insert. An antenna is advanced into the conducting ring insert such that the flex connector live signal portion electrically connects with a corresponding live signal portion of the antenna (Block 230). A lower portion of the flex connector is engaged with corresponding spaced-apart live signal and ground contact pads on the printed circuit board, thereby completing the ground and live signal electrical paths to a radiotelephone (Block 240).

Although the antenna is shown throughout as a retractable antenna, it will be appreciated by one of skill in the art that the invention can also easily employ a standard or non-retractable (stationary) antenna. Further, although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. An antenna connector, comprising:
   an antenna connector conductor strip having opposing first and second ends adapted for transmitting a radiotelephone signal between an antenna having an outwardly extending portion and a source and a receiver;
   at least one antenna connector ground strip having first and second opposing ends adapted for transmitting a radiotelephone signal between the antenna and the source and the receiver; and
   an antenna connector non-conducting thin carrier ribbon for holding said at least one antenna connector ground strip and said antenna connector conductor strip in substantial alignment, wherein each of said at least one antenna connector ground strips and said antenna connector conductor strip are spaced-apart and define a gap therebetween, wherein said source and said receiver are in electrical communication with a printed circuit board and wherein, when assembled in position, said antenna connector extends between and electrically connects the antenna with said printed circuit board, and wherein when assembled in position, said ground strip, said carrier ribbon, and said conductor strip define a body with a thin concave contour when viewed from the side.

2. An antenna connector according to claim 1, wherein said antenna is a longitudinally extendable and retractable antenna, and wherein said carrier ribbon and conductor and ground strips have first and second opposing ends and are configured such that said antenna connector has a first substantially flat configuration when unassembled and a second concave contoured configuration upon assembly, said concave contoured configuration defined between said antenna on one end and said printed circuit board on said second opposing end, wherein said at least one antenna connector ground strip comprises first and second antenna connector ground strips disposed on opposing sides of said antenna connector conductor strip, and wherein said antenna connector first ground strip and said antenna connector conductor strip define a first gap therebetween and said antenna connector second ground strip and said antenna connector conductor strip define a second gap therebetween.

3. An antenna connector according to claim 2, wherein said first and second gaps are the same size and remain constant in width along the length of said antenna connector carrier ribbon, and wherein said conductor strip has an associated width identified as (2a) and said first and second gaps have an associated width identified as (b) and said conductor strip and said first and second gaps are configured to provide a ratio (a/b) value of above about 0.5 and wherein said first and second gaps and said antenna connector conductor strip are sized to provide a radiotelephone signal path having a 50 Ω impedance rating.

4. An antenna connector according to claim 3, wherein said conductor strip widths and gaps are selected such that the ratio a/b meets a predetermined value corresponding to the dielectric strength of the material used to form said conductor strips.

5. An antenna connector according to claim 4, wherein the geometric relationship is configured such that the ratio a/b is about 0.85.

6. An antenna connector according to claim 2, wherein said second end of each of said first and second antenna connector ground strips and said antenna conductor strip include at least one downwardly extending contact protrusion positioned thereon, and wherein each of said contact protrusions are configured to frictionally engage with the top surface of the printed circuit board, thereby providing improved electrical connection therewith.

7. An antenna connector according to claim 1, wherein each of said ground and said conductor first ends are configured to include a contact protrusion for increasing contact surface thereon, thereby providing improved electrical connection.

8. A radiotelephone, comprising:

a radiotelephone housing;

a printed circuit board including top and bottom surfaces and comprising at least one signal contact and at least one ground contact, each of which is spaced apart from said at least one signal contact, disposed in said housing;

an antenna which is mechanically attached to said housing and disposed therein such that it is free to extend outwardly from said housing; and a flex connector having opposing top and bottom ends and including at least one ground and a separate signal electrical path extending between said antenna on one end and said printed circuit board on the other end, said bottom end being separately electrically connected to corresponding ones of said printed circuit board ground and signal contacts and said top end being configured to engage with said antenna and said housing, thereby providing continuous electrical paths between said antenna and said printed circuit board;

wherein said flex connector bottom end resides against said top surface of said printed circuit board and wherein said flex connector top end resides against predetermined portions of said antenna and said housing, and wherein said flex connector defines a concave contour directionally facing the inside of said housing between said printed circuit board and said antenna, and wherein said antenna is disposed in said housing above the top surface of said printed circuit board.

9. A telephone according to claim 8, wherein said at least one signal contact and said at least one ground contact comprises one signal contact and first and second ground contacts disposed on opposing sides of said signal contact to define three serially aligned contact surfaces, a first ground contact, a signal contact, and a second ground contact, respectively.

10. A radiotelephone according to claim 8, wherein said antenna is longitudinally retractable and freely retractable beyond said flex connector top end into said radiotelephone housing.

11. A telephone according to claim 8, wherein said telephone housing further comprises a conducting insert affixed to said housing end portion for securing said antenna to said housing.

12. A telephone according to claim 11, wherein said antenna includes a live signal portion which projects inwardly into said housing, wherein said flex connector upper portion is electrically attached to said housing insert to provide an electrical ground and wherein said flex connector upper portion is separately electrically connected to said live signal antenna portion.

13. A method of assembling a radiotelephone, comprising the steps of:

mounting a printed circuit board including at least one ground and a spaced-apart signal antenna contact surface thereon in a housing such that the ground and the signal contacts are adjacent an end of the housing;

inserting a conducting ground ring insert into the end of the housing to fixedly attach thereto;

fixedly attaching an upper portion of a flex connector having separate ground and live signal paths longitudinally extending along its length to the conducting ground ring insert such that the ground path is electrically connected thereto;

advancing an antenna into the conducting ground ring insert such that the flex connector live signal portion electrically connects with a corresponding live signal portion of the antenna; and engaging a lower portion of the flex connector with corresponding spaced-apart live signal and ground contact pads on the printed circuit board such that said flex connector defines a thin concave contour facing the inside of the housing and extending between the antenna and ground insert and the printed circuit board, thereby completing the antenna ground and live signal electrical paths to a radiotelephone.

14. A method according to claim 13, wherein said advancing step comprises advancing a retractable antenna.

15. A method according to claim 13, wherein said flex connector lower portion is frictionally engaged with corresponding printed circuit contacts.

16. A radiotelephone antenna assembly, comprising:

a retractable radiotelephone antenna defining a central axis extending in the longitudinal direction through the center thereof having axially aligned outwardly and inwardly extending projections, and a threaded outer surface portion, said inwardly extending projection having an outer surface which includes an electrical live signal contact surface thereon;

a conducting circular skirt having opposing top and bottom ends and an outer surface, said circular skirt including an opening formed through the center thereof, said opening adapted to threadably receive said antenna threaded portion, said circular skirt being axially aligned with said antenna, said skirt bottom having a planar surface with a lateral thickness defined by two concentric circles drawn with respect to the central axis, said skirt bottom providing a ground contact surface thereon;

a housing member having opposing first and second ends attached to said circular skirt outer surface for mounting said antenna to a radiotelephone housing;

an antenna connector configured with a thin profile body having opposing first and second ends comprising a live signal electrical path and at least one ground electrical path extending therebetween, wherein said electrical paths are spaced-apart and aligned in a predetermined coplanar manner, said coplanar antenna connector first end is separately electrically engaged with said antenna electrical live signal contact surface and said circular skirt ground contact surface; and a printed circuit board positioned adjacent said antenna and said coplanar antenna connector, said printed circuit board including a live signal contact and at least one spaced-apart ground contact thereon, wherein said at least one ground contact and said live signal contact are aligned in a coplanar manner to correspond with said coplanar antenna connector at least one ground electrical path and live signal electrical path, and wherein said coplanar antenna connector second end engages with said printed circuit board live signal and ground contacts, wherein said antenna connector is configured as a curvilinear structure extending between said printed circuit board on one end and said conducting skirt and said antenna on said opposing end, thereby providing a radiotelephone signal path between said printed circuit board, said coplanar antenna connector, and said antenna.

17. A radiotelephone antenna assembly according to claim 16, wherein said coplanar antenna connector comprises first and second ground electrical paths disposed on opposing sides of said electrical live signal path, wherein said first ground electrical path and said live signal electrical path define a first gap therebetween and said second ground electrical path and said live signal electrical path define a second gap therebetween, and wherein said printed circuit board comprises corresponding first and second ground contacts are disposed on opposing sides of said live signal contact, wherein said first ground contact and said live signal contact define a first gap corresponding to said antenna connector first gap and said second ground contact and said live signal contact define a second gap corresponding to said antenna connector second gap, thereby providing increased signal shielding.

18. A radiotelephone assembly according to claim 18, wherein said antenna connector second end frictionally engages with said printed circuit board live signal and ground contacts.

\* \* \* \* \*

UNITED STATES PATENT AND TRADEMARK OFFICE
CERTIFICATE OF CORRECTION

PATENT NO. : 6,181,950 B1  
DATED : January 30, 2001  
INVENTOR(S) : Gregory S. Mendolia It is certified that error appears in the above-identified patent and that said Letters Patent is hereby corrected as shown below:

Column 14, claim 18,
Line 7, correct the dependency of claim 18 by deleting "claim 18" and replacing -- claim 16 -- therefor.

Signed and Sealed this

Eighth Day of January, 2002

Attest:

JAMES E. ROGAN  
Attesting Officer    Director of the United States Patent and Trademark Office